US 6,624,074 B1

(12) United States Patent
Lopatin et al.

(10) Patent No.: US 6,624,074 B1
(45) Date of Patent: *Sep. 23, 2003

(54) METHOD OF FABRICATING A SEMICONDUCTOR DEVICE BY CALCIUM DOPING A COPPER SURFACE USING A CHEMICAL SOLUTION

(75) Inventors: Sergey Lopatin, Santa Clara, CA (US); Joffre F. Bernard, Santa Clara, CA (US); Paul L. King, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/218,532

(22) Filed: Aug. 13, 2002

Related U.S. Application Data

(62) Division of application No. 09/728,314, filed on Nov. 30, 2000.

(51) Int. Cl.$^7$ ................................................. H01L 21/44
(52) U.S. Cl. ........................................ 438/687; 438/761
(58) Field of Search ............................ 257/762, 744, 257/750, 741; 438/602, 652, 687, 761

(56) References Cited

U.S. PATENT DOCUMENTS

| | | | | |
|---|---|---|---|---|
| 5,143,867 A | * | 9/1992 | d'Heurle et al. | 438/660 |
| 5,893,752 A | * | 4/1999 | Zhang et al. | 438/687 |
| 5,969,422 A | * | 10/1999 | Ting et al. | 257/762 |
| 6,090,710 A | * | 7/2000 | Andricacos et al. | 438/687 |
| 6,181,012 B1 | * | 1/2001 | Edelstein et al. | 257/762 |
| 6,258,717 B1 | * | 7/2001 | Uzoh et al. | 438/677 |
| 6,469,387 B1 | * | 10/2002 | Lopatin et al. | 257/750 |

OTHER PUBLICATIONS

Peter Van Zant, Microchip Fabrication: A Practical Guide to Semiconductor Processing, 1997, p. 397, 3$^{rd}$ Edition, McGraw–Hill, USA.

* cited by examiner

Primary Examiner—Wael Fahmy
Assistant Examiner—Hoai Pham
(74) Attorney, Agent, or Firm—LaRiviere, Grubman & Payne, LLP

(57) ABSTRACT

A method of fabricating a semiconductor device having contaminant-reduced Ca-doped Cu surfaces formed on Cu interconnects by cost-effectively depositing a Cu—Ca—X surface and subsequently removing the contaminant layer contained therein; and a device thereby formed. In the Cu—Ca—X surface, where contaminant X=C, S, and O, removal of the contaminant from such surface is achieved by (a) immersing the Cu interconnect surface into an electroless plating solution comprising Cu salts, Ca salts, their complexing agents, a reducing agent, a pH adjuster, and at least one surfactant for facilitating Ca-doping of the Cu interconnect material; and (b) annealing of the Cu—Ca—X surface under vacuum onto the underlying Cu interconnect material to form a Cu—Ca film on Cu interconnect structure, thereby producing a uniform Cu—Ca film (i.e., Cu-rich with 0.2–5% Ca) on the Cu surface of an interconnect for maximizing Ca—Cu/Cu interconnect structure reliability, electromigration resistance, and corrosion prevention. The annealing step primarily removes O and secondarily removes C and S, especially when performed under vacuum, an inert gas, or a reducing ambient such as ammonia ($NH_3$) plasma. Thus, the resultant device then comprises a distinctive contaminant-reduced Ca—Cu/Cu interconnect structure.

11 Claims, 2 Drawing Sheets

METHOD OF FABRICATING A SEMICONDUCTOR DEVICE BY CALCIUM DOPING A COPPER SURFACE USING A CHEMICAL SOLUTION

CROSS-REFERENCE TO RELATED APPLICATION(S)

This application is a divisional application of, and claims priority from, U.S. Ser. No. 09/728,314, entitled "Semiconductor Device Formed by Calcium Doping a Copper Surface Using a Chemical Solution," filed Nov. 30, 2000. The divisional application is also technologically related to the following commonly assigned applications which have been concurrently filed with the priority document:

(1) U.S. Ser. No. 09/728,313, entitled "Chemical Solution for Cu—Ca—O Thin Film Formations on Cu Surfaces;"

(2) U.S. Ser. No. 09/728,315, entitled "Method of Forming Cu—Ca—O Thin Films on Cu Surfaces in a Chemical Solution and Semiconductor Device Thereby Formed;"

(3) U.S. Ser. No. 09/728,312, entitled "Method of Reducing Carbon, Sulphur, and Oxygen Impurities in a Calcium-Doped Cu Surface and Semiconductor Device Thereby Formed;"

(4) U.S. Ser. No. 09/728,684, entitled "Method of Reducing Electromigration in Copper Lines by Calcium-Doping Copper Surfaces in a Chemical Solution and Semiconductor Device Thereby Formed;" and (5) U.S. Ser. No. 09/728,685, entitled "Method of Reducing Electromigration in Copper Lines by Forming an Interim Layer of Calcium-Doped Copper Seed Layer in a Chemical Solution and Semiconductor Device Thereby Formed."

TECHNICAL FIELD

The present invention relates to semiconductor devices and their methods of fabrication. More particularly, the present invention relates to calcium-doping of a copper surface (e.g., interconnect material) and resultant devices utilizing such a process. Even more particularly, the present invention relates to reducing and minimizing carbon, sulphur, and oxygen impurities in a calcium-doped copper interconnect surface.

BACKGROUND OF THE INVENTION

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractor metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. Cu interconnect material may be deposited by chemical vapor deposition (CVD), plasma enhanced chemical vapor deposition (PECVD), sputtering, electroless plating, and electrolytic plating. However, some disadvantages of using Cu as an interconnect material include etching problems, corrosion, and diffusion into silicon.[1] These problems have sparked further research into the formulation of barrier materials for Cu, which in turn, identified another host of problems associated with the barrier materials themselves (e.g., contamination).

[1] Peter Van Zant, Microchip Fabrication: A Practical Guide to Semiconductor Processing, 3$^{rd}$ Ed., p. 397 (1997).

In response to interconnect impurity level concerns relating to the fabrication of semiconductor devices having doped copper interconnect surfaces, the industry has been utilizing chemical vapor deposition (CVD) methods. Ca, if used as a dopant, would be an inherently highly reactive element in air; therefore, a Ca-doped Cu surface would behave similarly. Contamination in the doped Cu surfaces is especially problematic when wet-chemical methods are used for processing. Doped Cu surfaces have been found to be highly susceptible to carbon (C), sulphur (S), and oxygen (O) contamination, forming an impure layer on the order of 10–20 Å in thickness, as characterized by AES/XPS methods. However, although CVD has been conventionally used for depositing other metal(s) on an interconnect surface, CVD is not a cost-effective method of doping Cu interconnect surfaces with Ca ions. Therefore, a need exists for providing a method of fabricating a semiconductor device by doping a Cu interconnect surface and by cost-effectively removing the contaminant layer of the doped Cu surface.

BRIEF SUMMARY OF THE INVENTION

Accordingly, the present invention provides a method of fabricating a semiconductor device having contaminant-free Ca-doped Cu surfaces formed on Cu interconnects by cost-effectively depositing a Cu—Ca—X surface (e.g., a Cu—Ca—O surface) and subsequently removing the contaminant layer contained therein; and a device thereby formed. Formation of the Cu—Ca—X surface, where the contaminant X=C, S, or O, removal of such contaminant from the Cu—Ca—X surface is achieved by (a) immersing the Cu interconnect surface into an electroless plating solution comprising Cu salts, Ca salts, their complexing agents, a reducing agent, a pH adjuster, and at least one surfactant for facilitating Ca-doping of the Cu interconnect material; and (b) annealing of the Cu—Ca—X surface under vacuum onto the underlying Cu interconnect material to form a Cu—Ca film on Cu interconnect structure, thereby producing a uniform Cu—Ca film (i.e., Cu-rich with 0.2–5% Ca) on the Cu surface of an interconnect for maximizing Ca—Cu/Cu interconnect structure reliability, electromigration resistance, and corrosion prevention. The annealing step primarily removes O and secondarily removes C and S, especially when performed under vacuum, an inert gas, or a reducing ambient such as ammonia ($NH_3$) plasma. Thus, the resultant device then comprises a distinctive contaminant-reduced Ca—Cu/Cu interconnect structure.

BRIEF DESCRIPTION OF THE DRAWING

For a better understanding of the present invention, reference is made to the below-referenced accompanying Drawing. Reference numbers refer to the same or equivalent parts of the present invention throughout the several figures of the drawing.

DETAILED DESCRIPTION OF THE INVENTION

Figure 1:
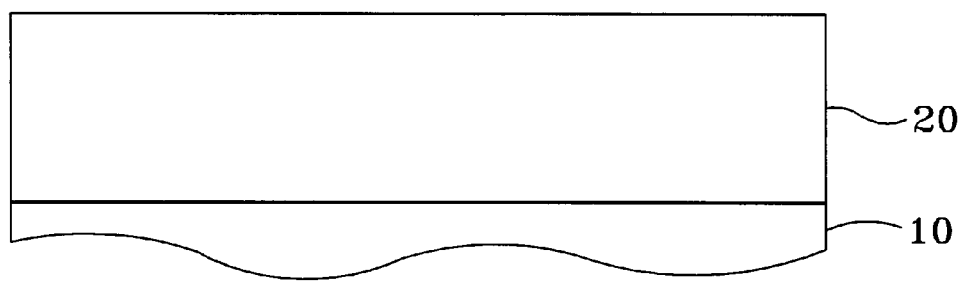
FIG. 1 is a cross-sectional view of a semiconductor substrate having formed thereon a Cu film via a conventional method such as PVD or CVD, in accordance with the related art.

FIG. 1 illustrates, in cross-section, a semiconductor substrate 10 such as a silicon wafer, having formed thereon a Cu film 20 via a conventional method such as PVD or CVD, in accordance with the related art.

Figure 2:
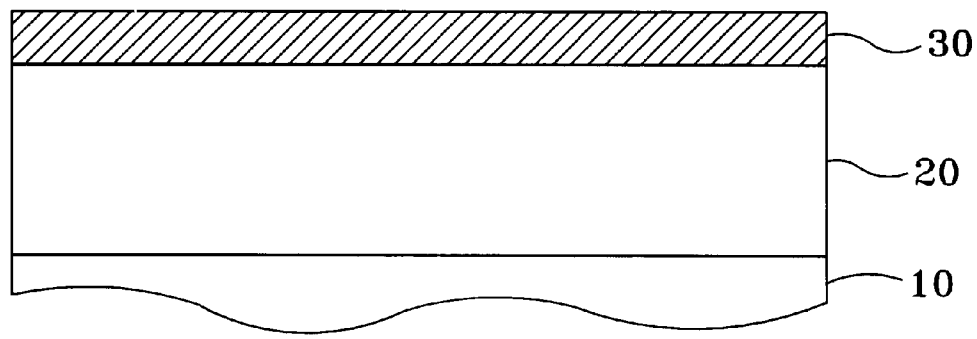
FIG. 2 is a cross-sectional view of the semiconductor substrate having formed thereon the Cu film, the Cu film having formed thereon a Cu—Ca—X film via treatment in an electroless plating solution, as shown in FIG. 1, in accordance with the present invention.

FIG. 2 illustrates, in cross-section, the semiconductor substrate 10, having formed thereon the Cu film 20, as shown in FIG. 1, the Cu film 20 having formed thereon a Cu—Ca—X film 30 via treatment in an electroless plating solution, in accordance with the present invention.

Figure 3:
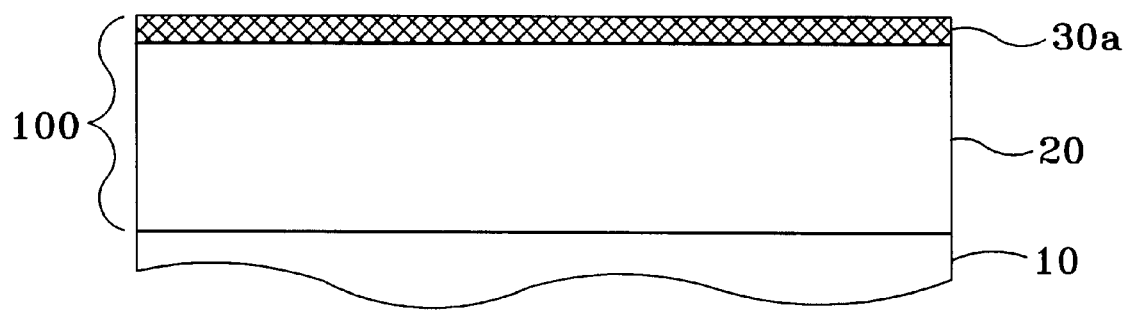
FIG. 3 is a cross-sectional view of the semiconductor substrate having formed thereon the Cu film, the Cu film having formed thereon the Cu—Ca—X film via treatment in the electroless plating solution, as shown in FIG. 2, the Cu—Ca—X film being annealed in a range of 250° C. to 450° C., under vacuum, onto the Cu film, forming a Cu—Ca film on the Cu film, thereby forming a contaminant-reduced Ca—Cu/Cu interconnect structure, in accordance with the present invention.

FIG. 3 illustrates, in cross-section, the semiconductor substrate 10 having formed thereon the Cu film 20, the Cu film 20 having formed thereon the Cu—Ca—X film 30 via treatment in an electroless plating solution, as shown in FIG. 2, the Cu—Ca—X film 30 being annealed in a range of 250° C. to 450° C., under vacuum, onto the Cu film 20, forming a Cu—Ca film 30a onto the Cu film 20, thereby forming a contaminant-reduced Ca—Cu/Cu interconnect structure 100, in accordance with the present invention. Further, the chemical solution may comprise an electroless plating solution, which in turn, may comprise Cu salts, Ca salts, complexing agents, reducing agents, pH adjusters, and surfactants. The Cu—Ca film is Cu-rich and may have a Ca-doping level in a range of 0.2 atomic % to 5 atomic % and a thickness in a range of 15 Å to 150 Å. The Cu film 20 does not contain Ca, has a resultant thickness in a range of 0.3 $\mu$m to 0.7 $\mu$m, and has a low resistivity in a range of 1.67 $\mu\Omega$.cm to 1.8 $\mu\Omega$.cm. The Cu—Ca film is strongly adhered to the Cu film and has reduced C, S, and O impurities.

Figure 4:
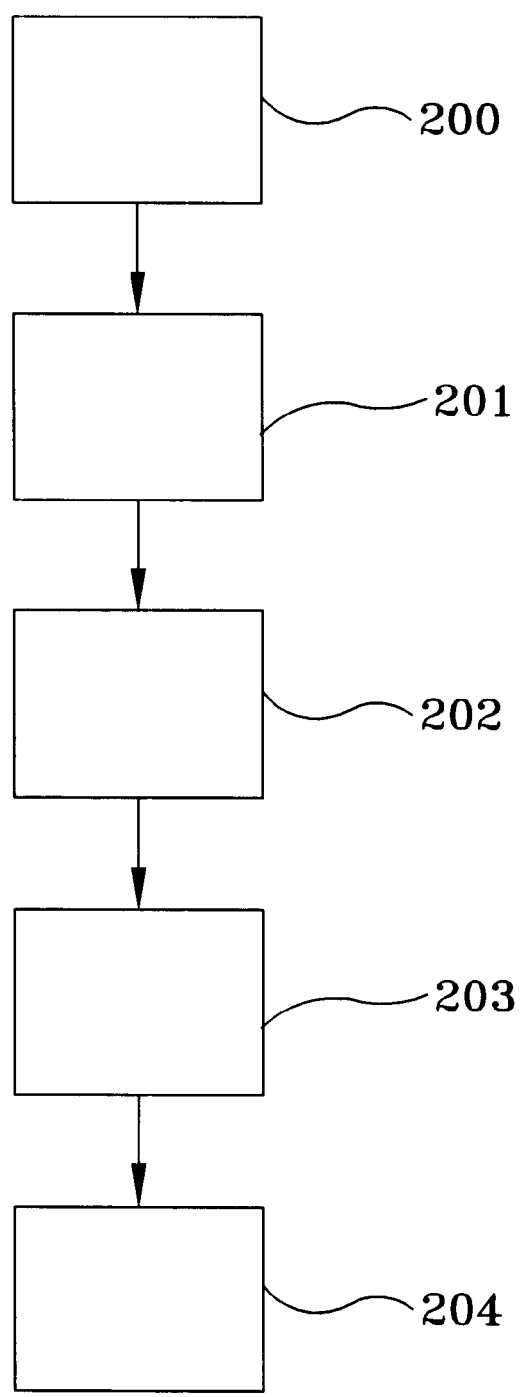
FIG. 4 is a flowchart of a method for fabricating a semiconductor device having a contaminant-free Ca—Cu/Cu interconnect structure, in accordance with the present invention.

FIG. 4 is a flowchart of a method M for fabricating a semiconductor device having a contaminant-reduced Ca—Cu/Cu interconnect structure 100, in accordance with the present invention. The method M comprises the steps of: providing a semiconductor substrate, as indicated by block 200; depositing a Cu film 20 on a semiconductor substrate 10 via a method such as electroplating, electroless plating, PVD, or CVD, as indicated by block 201; treating the Cu film 20 in an electroless plating solution, thereby depositing a Cu—Ca—X film 30 onto the Cu film 20, as indicated by block 202; annealing the substrate 10 having formed thereon the Cu film 20, the Cu film 20 having formed thereon the thin Cu—Ca film 30a, in a range of 250° C. to 450° C., under vacuum, thereby forming a Cu—Ca film 30a onto the Cu film 20, and thereby forming a contaminant-reduced Ca—Cu/Cu interconnect structure 100, as indicated by block 203; and completing formation of the semiconductor device, as indicated by block 204, in accordance with the present invention.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, to those of ordinary skill in the art, that various changes and modifications in form, semiconductor material, and fabrication material detail may be made, without departing from the spirit and scope of the inventions as set forth in the appended claims, should be readily apparent. No claim herein is to be construed under the provisions of 35 U.S.C. §112, sixth paragraph, unless the element is expressly recited using the phrase "means for."

What is claimed:

1. A method of fabricating a semiconductor device, having a contaminant-reduced Cu—Ca/Cu interconnect structure, comprising:

providing a semiconductor substrate;

forming a Cu film on the semiconductor substrate; and forming a contaminant-reduced Cu—Ca film on the Cu film, said contaminant-reduced Cu—Ca film forming step comprising:

utilizing an electroless plating treatment, using an electroless plating solution, for facilitating doping the Cu film with at least one plurality of ions selected from a group consisting of Cu ions and Ca ions and for facilitating forming a Cu—Ca—X film on the Cu film, X denoting at least one contaminant, and utilizing an annealing treatment for facilitating forming the contaminant-reduced Cu—Ca film on the Cu film and for facilitating forming the contaminant-reduced Cu—Ca/Cu interconnect structure on the semiconductor device, the contaminant-reduced Cu—Ca interconnect structure comprising the contaminant-reduced Cu—Ca film.

2. A method, as recited in claim 1, wherein the Cu film forming step comprises utilizing a technique selected from a group consisting of electroplating, electroless plating, chemical vapor deposition (CVD), plasma vapor deposition (PVD), and plasma enhanced chemical vapor deposition (PECVD).

3. A method, as recited in claim 1, wherein the step of utilizing the electroless plating treatment comprises using the electroless plating solution comprising:

a. providing at least one solvent;

b. providing at least one Cu salt;

c. providing at least one Ca salt;

d. providing at least one complexing agent; and e. providing at least one reducing agent, (b) through (e) being dissolved in (a).

4. A method, as recited in claim 3, wherein the step of utilizing the electroless plating treatment further comprises using the electroless plating solution further comprising:

f. providing at least one pH adjuster; and g. providing at least one surfactant, (f) and (g) being dissolved in (a).

5. A method, as recited in claim 1, wherein the Cu—Ca—X film forming step comprises forming the at least one contaminant being selected from a group consisting of carbon C), sulphur (S), and oxygen (O).

6. A method, as recited in claim 1, wherein the contaminant-reduced Cu—Ca film forming step comprises forming a Cu—rich film and comprises forming to a Ca-doping level in a range of 0.2 atomic % to 5 atomic %.

7. A method, as recited in claim 1, wherein the contaminant-reduced Cu—Ca film forming step comprises forming a Cu-rich film and comprises forming to a thickness in a range of 15 Å to 150 Å.

8. A method, as recited in claim 1, wherein the Cu film forming step comprises forming the Cu film to a thickness in a range of 0.3 μm to 0.7 μm.

9. A method, as recited in claim 1, wherein the Cu film forming step comprises forming the Cu film to a low resistivity in a range of 1.67 μΩ.cm to 1.8 μΩ.cm.

10. A method of fabricating a semiconductor device, having a contaminant-reduced Cu—Ca/Cu interconnect structure, comprising:

providing a semiconductor substrate;

forming a Cu film on the semiconductor substrate; and forming a contaminant-reduced Cu—Ca film on the Cu film, said contaminant-reduced Cu—Ca film forming step comprises:

utilizing an electroless plating treatment, using an electroless plating solution, for facilitating doping the Cu film with at least one plurality of ions selected from a group consisting of Cu ions and Ca ions and for facilitating forming a Cu—Ca—X film on the Cu film, X denoting at least one contaminant, and utilizing an annealing treatment for facilitating forming the contaminant-reduced Cu—Ca film on the Cu film and for facilitating forming the contaminant-reduced Cu—Ca/Cu interconnect structure, on the semiconductor device, the contaminant-reduced Cu—Ca interconnect structure comprising the contaminant-reduced Cu—Ca film, wherein the Cu film forming step comprises utilizing a technique selected from a group consisting of electroplating, electroless plating, chemical vapor deposition (CVD), plasma vapor deposition (PVD), and plasma enhanced chemical vapor deposition PECVD), wherein the step of utilizing an electroless plating treatment in the electroless plating solution, for facilitating doping of the Cu film with at least one plurality of ions selected from a group consisting of Cu ions and Ca ions, comprises using the electroless plating solution comprising:

(1) providing at least one solvent;

(2) providing at least one Cu salt;

(3) providing at least one Ca salt;

(4) providing at least one complexing agent;

(5) providing at least one reducing agent;

(6) providing at least one pH adjuster; and (7) providing at least one surfactant, (2) through (7) being dissolved in (1), and for facilitating depositing a Cu—Ca—X film on the Cu film, wherein X denotes at least one contaminant selected from a group consisting of C, S, and O, wherein the annealing treatment, for facilitating forming the contaminant-reduced Cu—Ca film on the Cu film, comprises utilizing the annealing treatment in a temperature range of 250° C. to 450° C. in an environment selected from a group consisting of a vacuum, an inert gas, and a reducing ambient, wherein the contaminant-reduced Cu—Ca film forming step comprises forming a Cu-rich film and comprises forming to a Ca-doping level in a range of 0.2 atomic % to 5 atomic %, and for facilitating forming the contaminant-reduced Cu—Ca/Cu interconnect structure, comprising the contaminant-reduced Cu—Ca film, on the semiconductor substrate, and wherein the Cu film forming step comprises forming the Cu film to a thickness in a range of 0.3 μm to 0.7 μm, and to a low resistivity in a range of 1.67 μΩ.cm to 1.8 μΩ.cm.

11. A method of fabricating a semiconductor device, having a contaminant-reduced Cu—Ca/Cu interconnect structure, comprising:

providing a semiconductor substrate;

forming a Cu film on the semiconductor substrate; and forming a contaminant-reduced Cu—Ca film on the Cu film, said contaminant-reduced Cu—Ca film forming step comprising:

utilizing an electroless plating treatment, using an electroless plating solution, for facilitating doping the Cu film with at least one plurality of ions selected from a group consisting of Cu ions and Ca ions and for facilitating forming a Cu—Ca—X film on the Cu film, X denoting at least one contaminant, and utilizing an annealing treatment for facilitating forming the contaminant-reduced Cu—Ca film on the Cu film and for facilitating forming the contaminant-reduced Cu—Ca/Cu interconnect structure, on the semiconductor device, the contaminant-reduced Cu—Ca interconnect structure comprising the contaminant-reduced Cu—Ca film, wherein the contaminant-reduced Cu—Ca film forming step comprises forming a Cu-rich film with a thickness of 15 Å to 150 Å and forming the Cu-rich film to a Ca-doping level in a range of 0.2 atomic % to 5 atomic %, and wherein the Cu film forming step comprises forming the Cu film to a thickness in a range of 0.3 μm to 0.7 μm and to a low resistivity in a range of 1.67 μΩ.cm to 1.8 μΩ.cm.

* * * * *